(12) United States Patent
Kaeding et al.

(10) Patent No.: US 10,566,686 B2
(45) Date of Patent: Feb. 18, 2020

(54) STACKED MEMORY PACKAGE INCORPORATING MILLIMETER WAVE ANTENNA IN DIE STACK

(71) Applicant: Micron Technology, Inc., Boise, ID (US)

(72) Inventors: John F. Kaeding, Boise, ID (US); Owen R. Fay, Meridian, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 16/021,463

(22) Filed: Jun. 28, 2018

(65) Prior Publication Data

US 2020/0006845 A1 Jan. 2, 2020

(51) Int. Cl.
*H01Q 21/00* (2006.01)
*H01Q 1/38* (2006.01)
*H01L 23/66* (2006.01)
*H01L 23/00* (2006.01)
*H01L 25/065* (2006.01)
*H01L 21/768* (2006.01)
*H01L 25/00* (2006.01)
(Continued)

(52) U.S. Cl.
CPC ......... *H01Q 1/38* (2013.01); *H01L 21/76898* (2013.01); *H01L 23/481* (2013.01); *H01L 23/66* (2013.01); *H01L 24/16* (2013.01); *H01L 24/81* (2013.01); *H01L 25/0657* (2013.01); *H01L 25/50* (2013.01); *H01Q 1/2283* (2013.01); *H01Q 1/243* (2013.01); *H01Q 21/0087* (2013.01); *H01L 2223/6677* (2013.01); *H01L 2223/6683* (2013.01); *H01L 2224/16146* (2013.01); *H01L 2225/06513* (2013.01); *H01L 2225/06541* (2013.01); *H01L 2924/1423* (2013.01); *H01L 2924/1434* (2013.01); *H01Q 1/2266* (2013.01)

(58) Field of Classification Search
CPC ...... H01Q 1/38; H01Q 21/0087; H01Q 1/243; H01Q 1/2283; H01Q 1/2266; H01L 23/481; H01L 25/50; H01L 24/81; H01L 21/76898; H01L 25/0657; H01L 24/16; H01L 23/66; H01L 2924/1423; H01L 2223/6677; H01L 2223/6683; H01L 2225/06541; H01L 2225/06513; H01L 2224/16146; H01L 2924/1434
USPC ......................................................... 343/893
See application file for complete search history.

(56) References Cited

U.S. PATENT DOCUMENTS 6,627,531 B2 * 9/2003 Enquist ............. H01L 21/76898
257/777
9,183,890 B2 * 11/2015 Choi ........................ G11C 5/02
(Continued)

*Primary Examiner* — Jean B Jeanglaude
(74) *Attorney, Agent, or Firm* — Parsons Behle & Latimer

(57) ABSTRACT

A stacked semiconductor device assembly may include a first semiconductor device having a first substrate and a first set of vias through the first substrate. The first set of vias may define a first portion of an antenna structure. The stacked semiconductor device assembly may further include a second semiconductor device having a second substrate and a second set of vias through the second substrate. The second set of vias may define a second portion of the antenna structure. The stacked semiconductor device assembly may also include a stack interconnect structure electrically coupling the first portion of the antenna structure to the second portion of the antenna.

20 Claims, 4 Drawing Sheets

(51) Int. Cl.
*H01Q 1/22* (2006.01)
*H01Q 1/24* (2006.01)
*H01L 23/48* (2006.01)

(56) References Cited

U.S. PATENT DOCUMENTS

| | | | | |
|---|---|---|---|---|
| 9,461,017 B1* | 10/2016 | Farooq | ................ | H01L 25/0657 |
| 2002/0064906 A1* | 5/2002 | Enquist | ............. | H01L 21/76898 |
| | | | | 438/109 |
| 2006/0292744 A1* | 12/2006 | Enquist | ............... | H01L 21/2007 |
| | | | | 438/107 |
| 2014/0252646 A1* | 9/2014 | Hung | .................... | H01L 23/481 |
| | | | | 257/774 |
| 2016/0329272 A1* | 11/2016 | Geissler | ................. | H01L 24/13 |

* cited by examiner

STACKED MEMORY PACKAGE INCORPORATING MILLIMETER WAVE ANTENNA IN DIE STACK

FIELD

The embodiments described herein relate to millimeter wave antennas and, in particular, stacked memory packages incorporating a millimeter wave antenna in a die stack.

BACKGROUND

As computing devices become more integrated into society, data access and mobility is becoming more important to a typical consumer. Compact wireless computing devices, such as cell phones, tablets, laptops, etc., are becoming faster, smaller, and more mobile. In order to meet the demands of new generation products, processing and memory packages within mobile devices must become faster and more compact. 5th Generation Wireless Systems (5G) provide high throughput, low latency, high mobility, and high connection density. Making use of millimeter wave bands (24-86 GHz) for mobile data communication is beneficial for producing 5G systems.

Antennas used for millimeter wave communication typically include an antenna array deposited on a printed circuit board (PCB) within a mobile device. The area, or real estate, occupied by the antennas may decrease the density of devices attached to the PCB and may result in larger, less mobile devices. Further, a horizontal millimeter wave antenna may cause interference to adjacent circuitry, over which the antenna may be deposited. These factors can make it difficult to incorporate millimeter wave antennas into mobile devices. Other disadvantages may exist.

Figure 1:
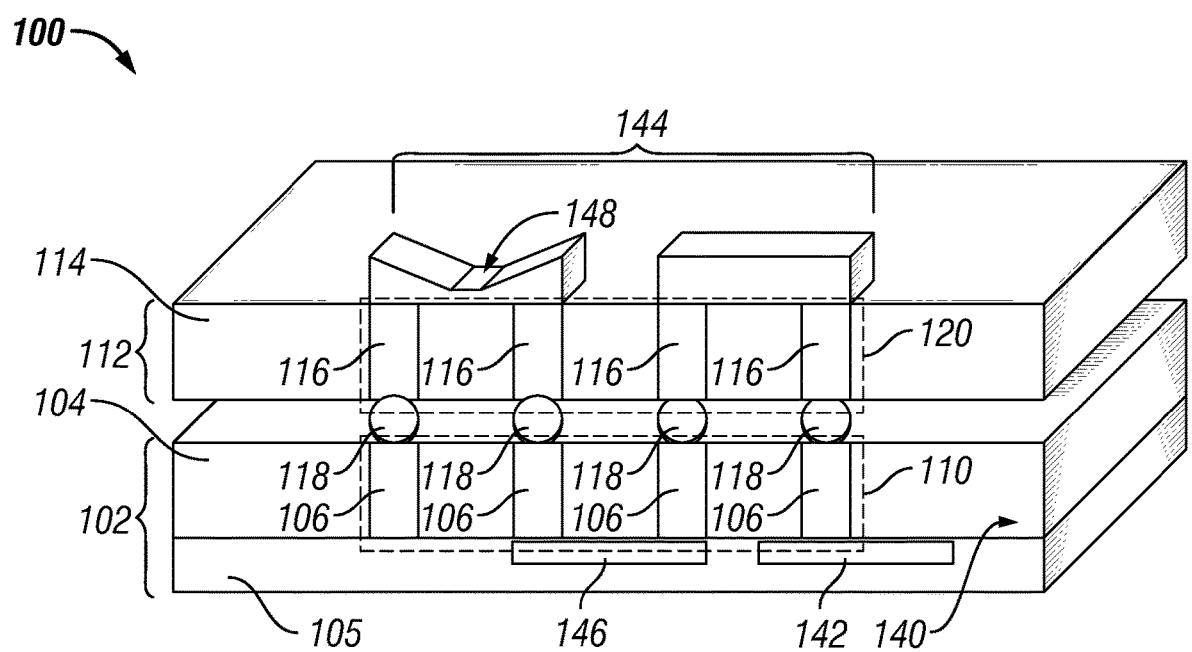
FIG. 1 is a diagram depicting an embodiment of a stacked semiconductor device assembly including a millimeter wave antenna structure.

While the disclosure is susceptible to various modifications and alternative forms, specific embodiments have been shown by way of example in the drawings and will be described in detail herein. However, it should be understood that the disclosure is not intended to be limited to the particular forms disclosed. Rather, the intention is to cover all modifications, equivalents and alternatives falling within the scope of the disclosure as defined by the appended claims.

DETAILED DESCRIPTION

In this disclosure, numerous specific details are discussed to provide a thorough and enabling description for embodiments of the present disclosure. One of ordinary skill in the art will recognize that the disclosure can be practiced without one or more of the specific details. Well-known structures and/or operations often associated with semiconductor devices may not be shown and/or may not be described in detail to avoid obscuring other aspects of the disclosure. In general, it should be understood that various other devices, systems, and/or methods in addition to those specific embodiments disclosed herein may be within the scope of the present disclosure.

The term "semiconductor device assembly" can refer to an assembly of one or more semiconductor devices, semiconductor device packages, and/or substrates, which may include interposers, supports, and/or other suitable substrates. The semiconductor device assembly may be manufactured as, but not limited to, discrete package form, strip or matrix form, and/or wafer panel form. The term "semiconductor device" generally refers to a solid-state device that includes semiconductor material. A semiconductor device can include, for example, a semiconductor substrate, wafer, panel, or a single die from a wafer or substrate. A semiconductor device may further include one or more device layers deposited on a substrate. A semiconductor device may refer herein to a semiconductor die, but semiconductor devices are not limited to semiconductor dies.

The term "semiconductor device package" can refer to an arrangement with one or more semiconductor devices incorporated into a common package. A semiconductor package can include a housing or casing that partially or completely encapsulates at least one semiconductor device. A semiconductor package can also include a substrate that carries one or more semiconductor devices. The substrate may be attached to or otherwise incorporate within the housing or casing.

As used herein, the terms "vertical," "lateral," "upper," and "lower" can refer to relative directions or positions of features in the semiconductor devices and/or semiconductor device assemblies shown in the Figures. For example, "upper" or "uppermost" can refer to a feature positioned closer to the top of a page than another feature. These terms, however, should be construed broadly to include semiconductor devices and/or semiconductor device assemblies having other orientations, such as inverted or inclined orientations where top/bottom, over/under, above/below, up/down, and left/right can be interchanged depending on the orientation.

Various embodiments of this disclosure are directed to semiconductor devices, semiconductor device assemblies, semiconductor packages, and methods of making and/or operating semiconductor devices. In one embodiment of the disclosure, a stacked semiconductor device assembly includes a first semiconductor device having a first substrate and a first set of vias through the first substrate, the first set of vias defining a first portion of an antenna structure. The semiconductor device assembly further includes a second semiconductor device having a second substrate and a second set of vias through the second substrate, the second set of vias defining a second portion of the antenna structure. The semiconductor device assembly also includes a stack interconnect structure electrically coupling the first portion of the antenna structure to the second portion of the antenna.

Referring to FIG. 1, a stacked semiconductor device assembly 100 is depicted. The assembly 100 may include a first semiconductor device 102 and a second semiconductor device 112. The semiconductor devices 102, 112 may be coupled in a stack configuration and may include circuitry to perform respective operations. In a non-limiting example, the first semiconductor device 102 may perform application processor-type functions and the second semiconductor device 112 may perform memory operations.

The first semiconductor device 102 may include a first substrate 104 with one or more device layers 105 formed thereon. The first substrate 104 may include a first set of vias 106 passing through the first substrate 104. The first set of vias 106 may define a first portion 110 of an antenna structure. The first substrate 104 may be a silicon substrate and the first set of vias 106 may be through-silicon-vias. Other types of semiconducting substrates may also be used.

The second semiconductor device 112 may include a second substrate 114. Although, not depicted in FIG. 1, the second semiconductor device 112 may also include one or more device layers formed thereon. The second substrate 114 may include a second set of vias 116 passing through the second substrate 114. The second set of vias 116 may define a second portion 120 of an antenna structure. The antenna structure may be suitable for millimeter wave antenna applications. For example, the antenna structure may facilitate using the semiconductor device assembly 100 for 5G communication protocols. However, the disclosure is not limited to 5G and millimeter wave communication.

The assembly 100 may further include a stack interconnect structure 118 that couples the first portion 110 of the antenna structure with the second portion 120 of the antenna structure, thereby forming a complete antenna. The interconnect structure 118 may include a ball-grid-array. For example, the first semiconductor device 102 may correspond to a first package and the second semiconductor device 112 may correspond to a second package. Both packages may be joined by a ball-grid-array (e.g., in a package-on-package configuration). Other configurations are also possible.

The first semiconductor device 102 may use the antenna structure for radio communication. For example, the first semiconductor device 102 may include a radio communication device 142, such as a transmitter, a receiver, a transceiver, or another type of radio communication device, coupled to the first portion 110 of the antenna structure. The radio communication device 142 may be configured for millimeter wave communication and may incorporate 5G systems.

The assembly 100 may include an interconnect matrix 144 to electrically couple at least two vias from the second set of vias 116. In practice, many more vias than two may be coupled to form a completed antenna as would be understood by persons of ordinary skill in the art having the benefit of this disclosure. By coupling vias from the second set of vias 116, columns of the antenna structure may be daisy chained to produce a full antenna. Additional interconnect circuitry 146 may also be located within the first semiconductor device 102. The interconnect matrix 144 may include a severable portion 148 (e.g., a fuse or a laser ablation region) to enable tuning of the antenna structure for a particular desired application. For example, by severing the severable portion 148, the area of the first and second antenna portions 110, 120 of the antenna structure may be modified, thereby changing the electrical characteristics exhibited by the antenna. The severable portion 148 may enable the second semiconductor device 112 to be usable with several different chip models and stack configurations, each having different radio antenna requirements. As such, depending on the requirements of the radio communication device 142, the antenna may be tuned.

The first semiconductor device 102 and the second semiconductor device may form, or be incorporated into, a stacked three-dimensional integrated circuit. As depicted in FIG. 1, the first portion 110 and the second portion 120 of the antenna structure may be positioned vertically along a surface of the stack. By being positioned along an outer surface of the stack, interference between the antenna structure and device layers (e.g., the device layers 105) may be reduced.

A benefit of the assembly 100 is that an antenna structure may be formed along a vertical edge of a semiconductor device stack instead of taking up valuable horizontal real estate on a chip or printed circuit board. Further, by being positioned along an edge of a stacked chip assembly, the antenna may cause less interference with the semiconductor devices. Other advantages may exist.

Figure 2:
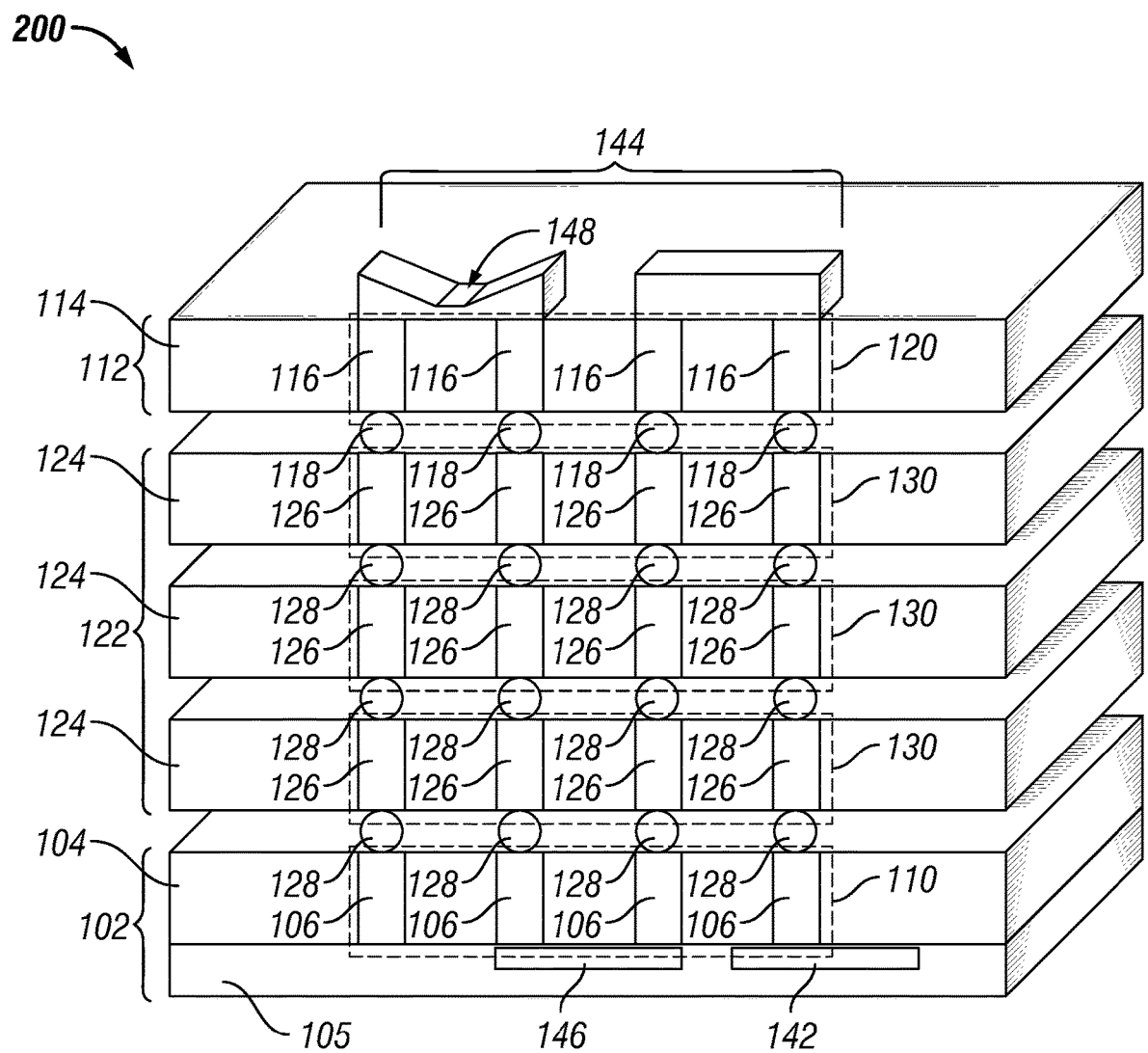
FIG. 2 is a diagram depicting an embodiment of a stacked semiconductor device assembly including a millimeter wave antenna structure.

Referring to FIG. 2, an embodiment of a stacked semiconductor device assembly 200 is depicted. The assembly 200 may include a first semiconductor device 102 and a second semiconductor device 112. The first semiconductor device 102 may include a first substrate 104 and one or more device layers 105. The device layers 105 may include a radio communication device 142 and/or other types of device circuits. Further, the assembly 100 may include a first set of vias 106 through the first substrate 104 and a second set of vias 116 through the second substrate 112. The assembly 200 may also include an interconnect matrix 144 having a severable portion 148 and additional interconnect circuitry 146.

The assembly 200 may include one or more additional semiconductor devices 122. The additional semiconductor devices 122 may be positioned between the first semiconductor device and the second semiconductor device 112. Although FIG. 2 depicts three additional semiconductor devices, the exact number of additional semiconductor devices 122 and the functions associated with each of the additional semiconductor devices 122 may vary depending on an application of the assembly 200. The additional semiconductor devices 122 may include additional substrates 124.

The additional substrates 124 may include additional sets of vias 126 through the additional substrates 124. The first set of vias 106 may define a first portion 110 of an antenna structure, the second set of vias 116 may define a second portion 120 of the antenna structure, and the additional sets of vias 126 may define additional portions 130 of the antenna structure. Each of the portions 110, 120, 130 of the antenna structure may be joined by additional interconnect structures. For example, the second portion 120 of the antenna structure may be joined with the additional portions of the antenna structure via a first stack interconnect structure 118 and each of the additional portions 130 may be joined together and joined to the first portion 110 by additional interconnect structures 128. The additional interconnect structures 128 may be ball-grid-arrays and may be usable for package-on-package configurations.

As shown in FIG. 2, a vertical surface of the semiconductor device assembly 200 may provide an area sufficient to form antenna structures that are usable with millimeter wave technology and 5G protocols. Further, by stacking the antenna vertically, critical space may be saved along the horizontal planes of the semiconductor devices 102, 112, 122, and on an associated PCB. Other benefits may exist.

Figure 3:
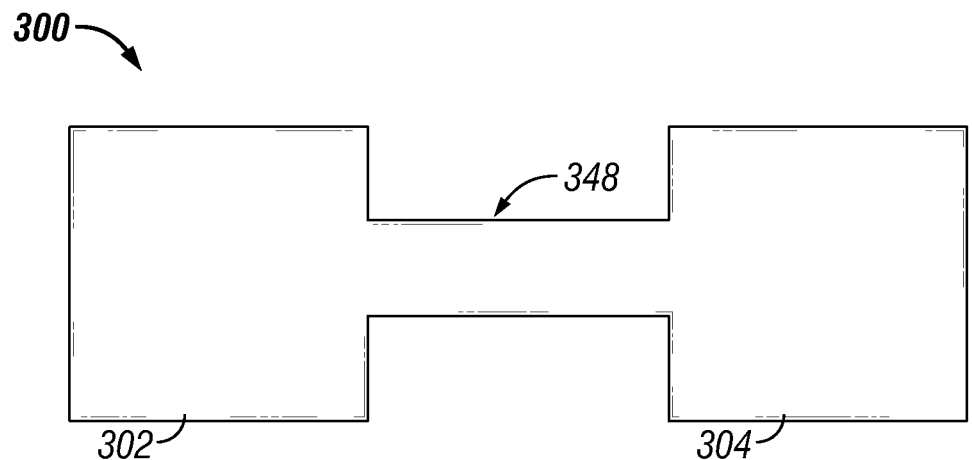
FIG. 3 is a diagram depicting an embodiment of an interconnect matrix with a laser ablation portion.

Referring to FIG. 3, an embodiment of an interconnect matrix 300 with a laser ablation portion 348 is depicted. The interconnect matrix 300 may correspond to the interconnect matrix 144, or a portion thereof, any may be used with the semiconductor device assemblies 100, 200. It should be noted that the interconnect matrix 300 is simplified to include only a single connection between electrodes. In practice, the interconnect matrix 300 may include many connections depending on the number of vias to be connected, as would be understood by persons of skill in the art having the benefit of this disclosure.

The interconnect matrix 300 may include a first electrode 302 and a second electrode 304. A laser ablation portion 348 may be exposed on a surface (e.g., on a top surface of the assembly 100). By exposing the laser ablation portion 348, a laser may be used to remove the laser ablation portion 348, thereby severing an electrical connection between the first electrode 302 and the second electrode 304. This may enable the antenna structure to be shortened, thereby decreasing the amount of area of the antenna structure. Different types of radio circuitry may require antennas of different sizes. By including a laser ablation portion 134, the antenna structure of FIGS. 1 and 2 may be tuned for a particular application. As such, the design of a semiconductor device (e.g., the second semiconductor device 112) may not need to be changed or customized for use with different lower chips in a stack.

Figure 4:
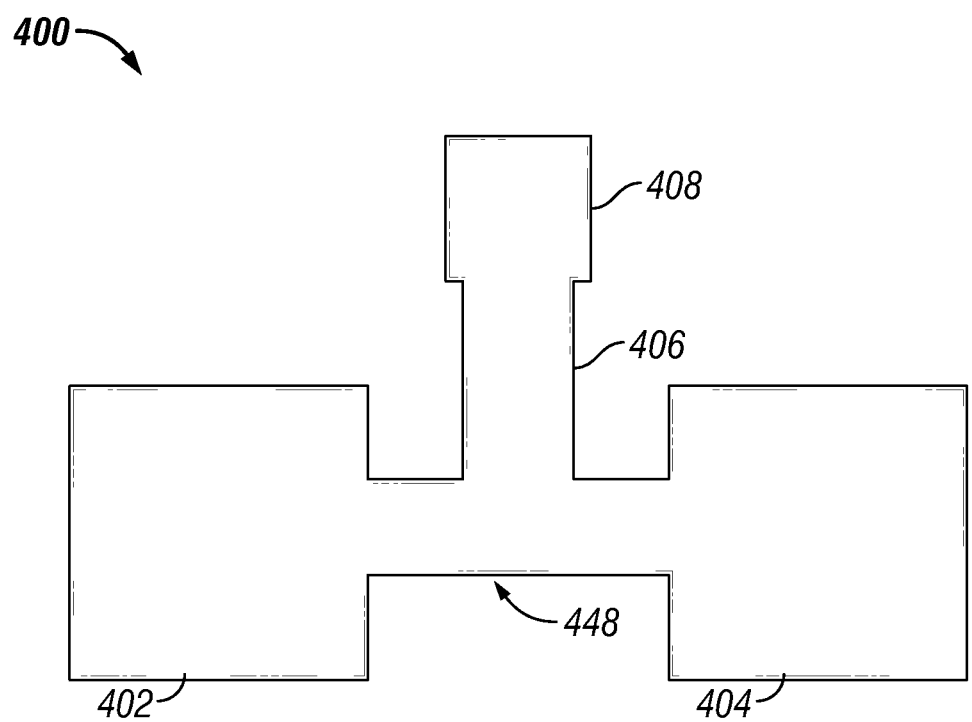
FIG. 4 is a diagram depicting an embodiment of an interconnect matrix with a fuse.

Referring to FIG. 4, an embodiment of an interconnect matrix 400 with a fuse 448, is depicted. The interconnect matrix 400 may correspond to the interconnect matrix 144 and may be used with the semiconductor device assemblies 100, 200. As with FIG. 3, although FIG. 4 depicts only a single connection between two electrodes, persons of ordinary skill in the art having the benefit of this disclosure, would understand that many connections may be made to electrically couple an antenna.

The interconnect matrix 400 may include a first electrode 402 and a second electrode 404 connected by a fuse 448. The interconnect matrix 400 may further include a pin 408 and a connector 406. By applying a current to the pin 408, the fuse 448 may be blown and the first electrode 402 may be disconnected from the second electrode 404. The connector 406 may be robust enough to limit breakdowns only to the fuse 448, thereby ensuring that an electrical connection between the first electrode 402 and the second electrode 404 is severed.

Blowing the fuse 448 may enable an antenna structure (e.g., defined by the portions 110, 120) to be shortened, thereby decreasing an amount of area associated with the antenna structure. Different types of radio circuitry may require antennas of different sizes. By including the fuse 448, the antenna structure may be tuned for a particular application.

Figure 5:
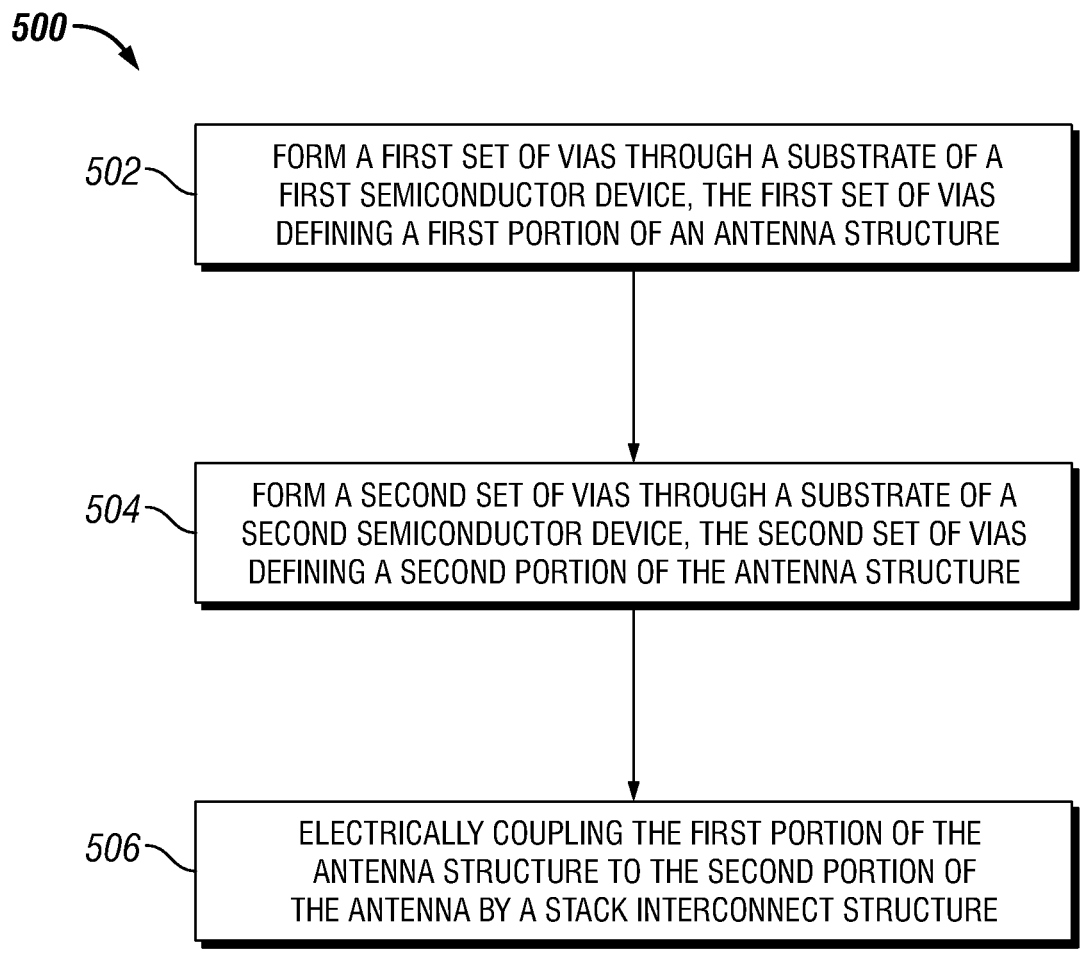
FIG. 5 is a flow diagram depicting an embodiment of a method for forming a stacked integrated circuit package including a millimeter wave antenna structure.

Referring to FIG. 5, an embodiment of a method 500 for forming a stacked integrated circuit package including a millimeter wave antenna structure is depicted. The method 500 may include forming a first set of vias through a substrate of a first semiconductor device, the first set of vias defining a first portion of an antenna structure, at 502. For example, the first set of vias 106 may be formed through the first substrate 104 to form the first portion 110 of the antenna structure.

The method 500 may further include forming a second set of vias through a substrate of a second semiconductor device, the second set of vias defining a second portion of the antenna structure, at 504. For example, the second set of vias 116 may be formed through the second substrate 114 to form the second portion 120 of the antenna structure.

The method 500 may also include electrically coupling the first portion of the antenna structure to the second portion of the antenna by a stack interconnect structure, at 506. For example, the stack interconnect structure 118 may be used to electrically couple the first portion 110 to the second portion 120 to form a completed antenna structure.

A benefit of the method 500 is that an antenna structure may be formed along a vertical edge of a semiconductor device stack instead of taking up valuable horizontal real estate on a chip or printed circuit board. Other advantages may exist.

Although this disclosure has been described in terms of certain embodiments, other embodiments that are apparent to those of ordinary skill in the art, including embodiments that do not provide all of the features and advantages set forth herein, are also within the scope of this disclosure. The disclosure may encompass other embodiments not expressly shown or described herein. Accordingly, the scope of the present disclosure is defined only by reference to the appended claims and equivalents thereof.

What is claimed is:

1. A stacked semiconductor device assembly comprising:
a first semiconductor device having a first substrate and a first set of vias through the first substrate, the first set of vias defining a first portion of an antenna structure;
a second semiconductor device having a second substrate and a second set of vias through the second substrate, the second set of vias defining a second portion of the antenna structure; and
a stack interconnect structure electrically coupling the first portion of the antenna structure to the second portion of the antenna structure.

2. The assembly of claim 1, further comprising:
one or more additional semiconductor devices, each having an additional substrate and an additional set of vias through the additional substrate, the additional set of vias defining an additional portion of the antenna structure; and
one or more additional interconnect structures electrically coupling the additional portion of the antenna structure of each of the additional semiconductor devices to the first portion of the antenna structure and the second portion of the antenna structure.

3. The assembly of claim 1, wherein the first semiconductor device and the second semiconductor device are incorporated into a stacked three-dimensional integrated circuit, and wherein the antenna structure extends along a vertical surface of the stacked three-dimensional integrated circuit.

4. The assembly of claim 1, wherein the first semiconductor device includes at least one of a transmitter, a receiver, or a transceiver, communicatively coupled to the antenna structure.

5. The assembly of claim 1, wherein the second semiconductor device includes an interconnect matrix electrically coupling at least two vias from the second set of vias in a daisy chain configuration.

6. The assembly of claim 5, wherein at least a portion of the interconnect matrix defines an exposed laser oblation zone for tuning the antenna structure.

7. The assembly of claim 5, wherein at least a portion of the interconnect matrix defines a fuse for tuning the antenna structure.

8. The assembly of claim 1, wherein the stack interconnect structure includes a ball-grid-array.

9. The assembly of claim 1, wherein the first substrate is a silicon substrate and the first set of vias are each through-silicon-vias, and wherein the second substrate is another silicon substrate and the second set of vias are each through-silicon-vias.

10. The assembly of claim 1, wherein the antenna structure is a millimeter wave antenna.

11. A method comprising:
forming a first set of vias through a first substrate of a first semiconductor device, the first set of vias defining a first portion of an antenna structure;
forming a second set of vias through a second substrate of a second semiconductor device, the second set of vias defining a second portion of the antenna structure; and
electrically coupling the first portion of the antenna structure to the second portion of the antenna by a stack interconnect structure.

12. The method of claim 11, further comprising, for one or more additional semiconductor devices:
forming an additional set of vias through an additional substrate, the additional set of vias defining an additional portion of the antenna structure; and
electrically coupling the additional portion of the antenna structure to the first portion of the antenna structure and the second portion of the antenna structure by an additional stack interconnect structure.

13. The method of claim 11, further comprising:
communicatively coupling at least one of a transmitter, a receiver, or a transceiver to the antenna structure.

14. The method of claim 11, further comprising:
electrically coupling at least two vias from the second set of vias in a daisy chain configuration by an interconnect matrix.

15. The method of claim 11, further comprising tuning the antenna through at least one of a laser oblation process or a fuse blowing process.

16. The method of claim 11, wherein the stack interconnect structure includes a ball-grid-array.

17. The method of claim 11, wherein the first substrate is a silicon substrate and the first set of vias are each through-silicon-vias, and wherein the second substrate is another silicon substrate and the second set of vias are each through-silicon-vias.

18. The method of claim 11, wherein the antenna structure is a millimeter wave antenna.

19. A stacked three-dimensional integrated circuit apparatus comprising:
a first semiconductor device having a first substrate;
a second semiconductor device having a second substrate; and
an antenna structure extending along a vertical surface of the stacked three-dimensional integrated circuit apparatus, the antenna structure defined by at least a first set of vias through the first substrate and a second set of vias through the second substrate.

20. The apparatus of claim 19, further comprising:
a stack interconnect structure electrically coupling the first set of vias to the second set of vias.

* * * * *